United States Patent [19]

Moore

[11]  4,044,397

[45]  Aug. 23, 1977

[54] INTEGRATED CIRCUIT WIRING BRIDGE APPARATUS

[75] Inventor: John H. Moore, Seattle, Wash.

[73] Assignee: The United States of America as represented by the Secretary of the Air Force, Washington, D.C.

[21] Appl. No.: 713,750

[22] Filed: Aug. 12, 1976

[51] Int. Cl.² ............................................. H05K 1/04
[52] U.S. Cl. .................................... 361/398; 361/410
[58] Field of Search ............... 361/398, 400, 403, 410; 339/19

[56]  References Cited

U.S. PATENT DOCUMENTS

| | | | |
|---|---|---|---|
| 3,221,286 | 11/1965 | Fedde | 361/398 |
| 3,418,535 | 12/1968 | Martinell | 361/403 |
| 3,474,297 | 10/1969 | Bylander | 361/398 |
| 3,538,389 | 11/1970 | Levesque et al. | 361/398 |
| 3,761,770 | 9/1973 | Alessio et al. | 361/403 |

Primary Examiner—David Smith, Jr.
Attorney, Agent, or Firm—Joseph E. Rusz; William Stephanishen

[57]  ABSTRACT

A flexible wiring bridge apparatus for integrated circuits providing circuit modifications of a semi-permanent nature.

5 Claims, 4 Drawing Figures

INTEGRATED CIRCUIT WIRING BRIDGE APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to integrated circuit devices, and in particular to a flexible wiring bridge apparatus for providing modifications to an integrated circuit configuration.

In the prior art, circuit modifications to integrated circuit devices to change signal paths required in general the use of jumper wires. In order to connect a jumper wire to a printed circuit board, a proper amount of heat is required to to insure a proper physical and electrical solder joint. This heat may be conducted by the metallic printed circuit to adjacent semiconductor devices or integrated circuits and may create premature destruction of the circuit devices.

Additional problems occur in making circuit modifications that must be repeated for large number of integrated circuit devices. A sense of uniformity may be lost, due to the difference in wire routing and individual technique. Furthermore, a maintenance problem is created and magnified by the attachment of jumper wire to an integrated circuit component lead when no other place for attachment exists. The wiring in circuits like these is not marked, or identified, and proper hookup, after replacement of an integrated circuit, becomes difficult. The present invention permits the connection of required jumpers to an integrated circuit without making an actual attachment to the circuit leads.

SUMMARY

The present invention utilizes a flexible bridge which may be soldered or pressure-fitted to the leads to an integrated circuit. The bridge comprises electrical conductors on a flexible base material. One end of each electrical conductor is in alignment with and may be soldered to the lead of the integrated circuit. The other end of each conductor has a pad for connection between the integrated circuit leads which permit circuit modification. The pad area will accept the soldering of required jumpers without excessive transmission of heat. The proper location of jumper wires may be retained by removing or lifting the bridge as a unit prior to integrated circuit replacement.

It is one object of the present invention, therefore, to provide an improved wiring bridge apparatus permitting repeatable signal path changes.

It is another object of the invention to provide an improved wiring bridge apparatus wherein the circuit modifications will be retained after replacement of an integrated circuit device.

It is yet another object of the invention to provide an improved wiring bridge apparatus wherein jumper wires may be applied or removed without the transmission of destructive heat to the integrated circuit device.

These and other advantages, features and objects of the invention will become more apparent from the following description taken in connection with the illustrative embodiment in the accompanying drawings.

DESCRIPTION OF THE PREFERRED EMBODIMENT

Figure 1:
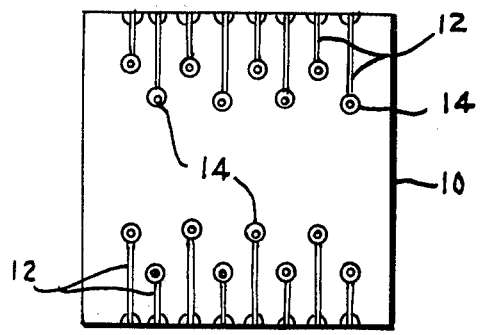
FIG. 1 is a plan view of the flexible wiring bridge apparatus in accordance with the present invention, FIG. 2a, b are front and side views respectively of the flexible wiring bridge apparatus mounted over a typical integrated circuit, and, FIG. 3 is a magnified view of the bond between the integrated circuit lead and bridge apparatus conductor shown in FIG. 2b.

Referring now to FIG. 1, there is shown a flexible wiring bridge apparatus which is comprised of a thin flexible base material 10 with a plurality of conductive leads 12 disposed thereon. The conductive leads 12 extend from both edges of the base material 10 towards the center thereof. Each of the plurality of conductive lease 12 is terminated in a conductive pad 14 which has a hole disposed in the center therein. The conductive leads 12 extend around the edge of the base material 12 to provide a conductive surface on both sides of the base material 10 at its edges. It is these inner conductive surfaces that are bonded or soldered to the lead of an integrated circuit package. The pads 14 are conductive only on the side shown on the base material 10. In an actual operation, the wiring bridge apparatus will be attached to the integrated circuit body by soldering the leads 12 to the integrated circuit leads. The pad area 14 will accept the soldering of required jumpers without excessive transmission of heat. The proper location of jumper wires will be retained by removing or lifting the bridge as a unit prior to integrated circuit replacement.

Figure 2A:
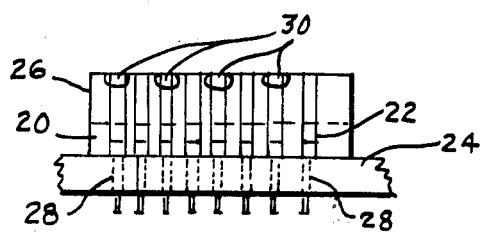

Turning now to FIG. 2a, there is shown a typical integrated circuit 20 having 16 terminals or leads 22 (in this side view only 8 leads are visible) mounted on a circuit board 24. The flexible bridge apparatus 26 is mounted over the integrated circuit 20 and is attached to the leads of the integrated circuit 20. It may be noted that while the present example deals with a thin flexible base material that the present invention may be practised through the use of a semi-rigid base material which is configured to the shape of the integrated circuit and held thereto by a pressure fit. The inner conductive leads 22 may be attached to the leads 28 of the integrated circuit by soldering. Some of the conductive pads 30 are visible in this view at the top of the flexible bridge apparatus 26. Although the present example has been presented with a 16 lead integrated circuit, it should be noted that the present apparatus may be utilized with any number of integrated circuit leads and with any configuration of integrated circuit leads. The flexible wiring bridge apparatus may be fabricated to conform to any integrated circuit package or lead configuration.

Figure 2B:
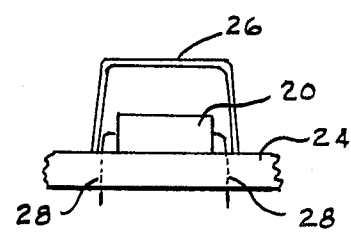

There is shown in FIG. 2b the manner in which the flexible bridge 26 is disposed and attached with respect to the integrated circuit 20. The leads 28 of the integrated circuit 20 extend through and below the printed circuit board 24. The leads of the flexible bridge apparatus 26 are in electrical contact with the leads 28 of the integrated circuit 20. There will be shown in greater detail in FIG. 4 the attachment of the conductive leads of the flexible bridge apparatus 26 with the leads 28 of the integrated circuit 20.

Figure 3:
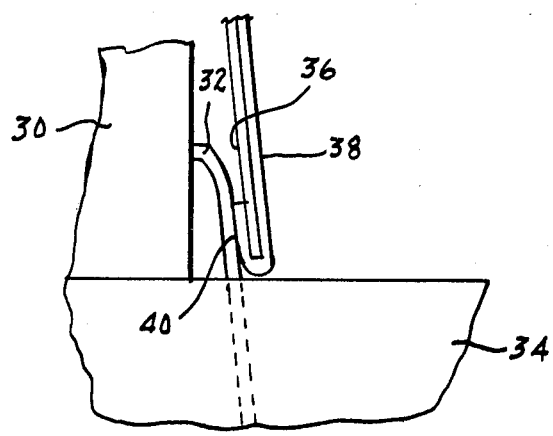

With particular reference now to FIG. 3, there is shown a magnified view of that portion of FIG. 2b wherein the leads of the flexible bridge apparatus and the integrated circuit are attached to each other. There is shown the body 30 of the integrated circuit having a connective lead 32 extending therefrom and through the printed circuit board 34. A portion of the flexible bridge apparatus base material 36 having a conductive lead 38 attached thereto is shown in relation to the integrated circuit body 30 and lead 32. The conductive lead 38 extends around both sides of the edge of the flexible base material 36 and is in contact with the integrated circuit lead 32. The conductive lead 38 and the integrated circuit lead 32 may be bonded to each other in the area of contact 40 shown by some suitable means such as solder. The conductive lead 38 may be bonded to the flexible base material 36 in any usual or convenient suitable manner that is available.

Although the invention has been described with reference to a particular embodiment, it will be understood to those skilled in the art that the invention is capable of a variety of alternative embodiments within the spirit and scope of the appended claims.

What is claimed is:

1. A wiring bridge apparatus comprising in combination:
   a bridge forming means mounted over an integrated circuit device, said bridge forming means only contacting the leads of said integrated circuit device, said bridge forming means being formed from a base material, said base material being non-conductive, and,
   a plurality of conductive leads bonded to said bridge forming means, said plurality of conductive leads extending around the edge of said bridge forming means and being disposed on both sides thereof, said plurality of conductive leads being in alignment with said integrated circuit device leads, said plurality of conductive leads being bonded to said integrated circuit device leads, said plurality of conductive leads extending toward the center of said bridge forming means, each of said plurality of conductive leads being terminated in a conductive pad, said conductive pad having a hole disposed in the center thereof, said hole extending through said bridge forming means.

2. A wiring bridge apparatus as described in claim 1 wherein said base material comprises a flexible non-conductive material.

3. A wiring bridge apparatus as described in claim 1 wherein said base material comprises a semi-rigid non-conductive material.

4. A wiring bridge apparatus as described in claim 2 wherein said bridge forming means is soldered to said leads of said integrated circuit device.

5. A wiring bridge apparatus as described in claim 2 wherein said bridge forming means is pressure-fitted over said leads of said integrated circuit device.

* * * * *